(12) United States Patent
McMillan et al.

(10) Patent No.: US 11,385,002 B2
(45) Date of Patent: Jul. 12, 2022

(54) IMPLEMENTING MODULAR BAFFLING MECHANISM FOR SELECTIVELY REDIRECTING AND IMPEDING AIRFLOW

(71) Applicant: International Business Machines Corporation, Armonk, NY (US)

(72) Inventors: Khaalid McMillan, Poughkeepsie, NY (US); Jason R. Eagle, Mantorville, MN (US); Robert K. Mullady, Poughkeepsie, NY (US); Scott R. LaPree, Rochester, MN (US); Robert R. Genest, Poughkeepsie, NY (US); William James Anderl, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 678 days.

(21) Appl. No.: 16/182,253

(22) Filed: Nov. 6, 2018

(65) Prior Publication Data
US 2020/0141666 A1     May 7, 2020

(51) Int. Cl.
*H05K 7/20* (2006.01)
*F28F 13/06* (2006.01)
*F28F 13/12* (2006.01)
*H05K 1/02* (2006.01)

(52) U.S. Cl.
CPC ............. *F28F 13/12* (2013.01); *F28F 13/06* (2013.01); *H05K 7/20* (2013.01); *F28F 2280/02* (2013.01); *H05K 1/0203* (2013.01)

(58) Field of Classification Search
CPC ............................ F28F 13/06; H05K 7/20145
See application file for complete search history.

(56) References Cited

U.S. PATENT DOCUMENTS

| | | | |
|---|---|---|---|
| 7,345,873 B2 | 3/2008 | Dey et al. | |
| 9,098,256 B2 | 8/2015 | Yen | |
| 9,302,223 B2 | 4/2016 | Lowell | |
| 9,521,778 B2 | 12/2016 | Lin et al. | |
| 9,723,749 B2 * | 8/2017 | Tang | H05K 7/20145 |
| 2006/0067046 A1 | 3/2006 | Dey et al. | |

(Continued)

FOREIGN PATENT DOCUMENTS

WO     20160201036     12/2016

OTHER PUBLICATIONS

Boonloi et al,, "Convective Heat Transfer, Friction factor and Thermal Performance In a Round Tube Equipped with the Modified V-shaped Baffle", Frontiers in Heat and Mass Transfer (FHMT), 2018, p. 10, vol. 6.

*Primary Examiner* — Livius R. Cazan
(74) *Attorney, Agent, or Firm* — Jorge R. Maranto

(57) ABSTRACT

Methods and structures are provided for implementing selective airflow modification. An airflow control member holder receives and retains an airflow control member having compliance characteristics allowing easy removal and changing of the airflow control member. The airflow control member holder includes retention features to facilitate mounting and removal from the system, such as mounting and removal from a printed circuit board (PCB). The airflow control member holder provides a protective function for a component, such as a depopulated component, a central processing unit (CPU) or other device.

12 Claims, 4 Drawing Sheets

(56) References Cited

U.S. PATENT DOCUMENTS

| | | | |
|---|---|---|---|
| 2011/0134603 A1* | 6/2011 | Yeh | H05K 7/20145 |
| | | | 361/679.47 |
| 2014/0366785 A1 | 12/2014 | Johnson, Jr. | |
| 2015/0355057 A1* | 12/2015 | Saari | G01N 1/04 |
| | | | 73/863.02 |
| 2015/0360176 A1 | 12/2015 | Bui et al. | |
| 2016/0262286 A1 | 9/2016 | Lin et al. | |
| 2017/0099746 A1 | 4/2017 | Rubenstein | |
| 2017/0292735 A1 | 10/2017 | Hjorth et al. | |

* cited by examiner

US 11,385,002 B2

IMPLEMENTING MODULAR BAFFLING MECHANISM FOR SELECTIVELY REDIRECTING AND IMPEDING AIRFLOW

FIELD OF THE INVENTION

The present disclosure relates generally to airflow baffling mechanisms, and more particularly, relates to methods and structures for implementing selective airflow modification in a system.

BACKGROUND

Thermal performance of a system is essential for reliable operation of many electronic components. Many design changes in a system require rapid and responsive impedance and airflow changes within the system.

As used in the present specification and claims, the terms circuit board, printed circuit board or PCB means a substrate or multiple layers (multi-layer) of substrates used to electrically attach electrical components and should be understood to generally include circuit cards, printed circuit cards, backplanes, printed wiring cards, printed wiring boards, flex circuits, and ceramic or organic chip packaging substrates.

SUMMARY

Principal aspects of the present disclosure are to provide methods and structures for implementing selective airflow modification. Other important aspects of the present disclosure are to provide such methods and structures substantially without negative effects and that overcome many of the disadvantages of prior art arrangements.

In brief, methods and structures are provided for implementing selective airflow modification. An airflow control member holder receives and retains an airflow control member having compliance characteristics allowing easy removal and changing of the airflow control member. The airflow control member holder includes retention features to facilitate mounting and removal from the system, such as mounting and removal from a printed circuit board (PCB).

In accordance with features of the disclosure, the airflow control member holder provides a protective function for a component, such as a depopulated component, central processing unit (CPU) or other device.

In accordance with features of the disclosure, the airflow control member includes an interchangeable perforation plate or baffling member.

In accordance with features of the disclosure, the airflow control member holder includes cooperating mating features with system retention features configured for easy removal from the printed circuit board (PCB). The airflow control member holder enables tool less removal and insertion of the airflow control member. The airflow control member holder protects a component socket, such as a CPU socket when the socket is not populated.

In accordance with features of the disclosure, the airflow control member is completely separated from the airflow control member holder with the airflow control member holder mounted on the PCB in the system.

In accordance with features of the disclosure, the retention features facilitating mounting and removal of airflow control member holder uniquely utilize an an associated component's mechanical support structure in the system.

In accordance with features of the disclosure, the airflow control member includes a selected one of a member has a perforation pattern and a baffling member. The airflow control member is formed of a sheet metal material, or a selected rigid molded material. The airflow control member holder is formed of an electrically non-conductive material having sufficient strength and rigidity for receiving and retaining an airflow control member.

BRIEF DESCRIPTION OF THE DRAWINGS

The present disclosure together with the above and other objects and advantages may best be understood from the following detailed description of the preferred embodiments of the disclosure illustrated in the drawings, wherein.

DETAILED DESCRIPTION OF THE PREFERRED EMBODIMENTS

In the following detailed description of embodiments of the disclosure, reference is made to the accompanying drawings, which illustrate example embodiments by which the disclosure may be practiced. It is to be understood that other embodiments may be utilized and structural changes may be made without departing from the scope of the disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the disclosure, methods and structures are provided for implementing selective airflow modification in a system.

Figure 1:
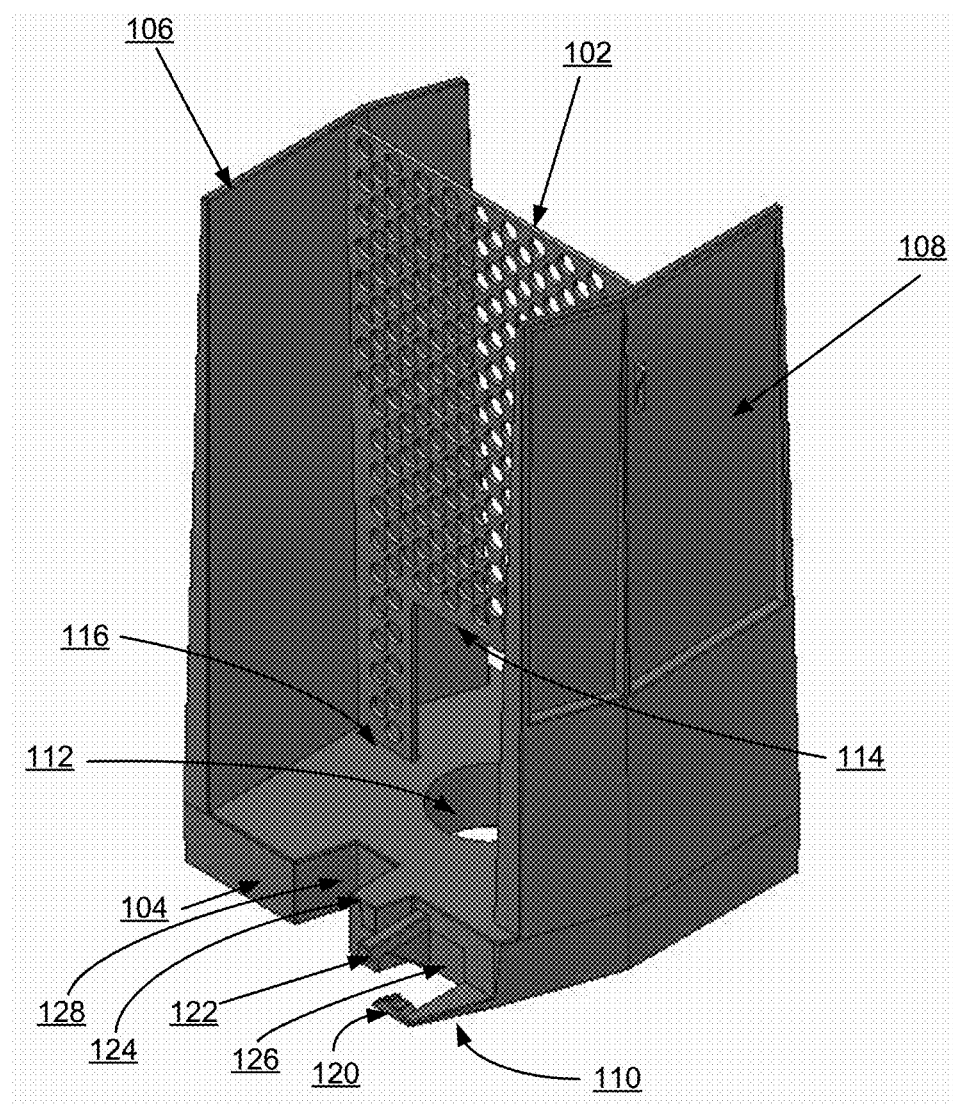
FIGS. 1 and 2 are respective perspective views not to scale schematically illustrating an example airflow control member holder with a respective airflow control member including a perforation pattern member in FIG. 1 and a baffling member in FIG. 2 in accordance with an illustrative embodiment.
Figure 2:
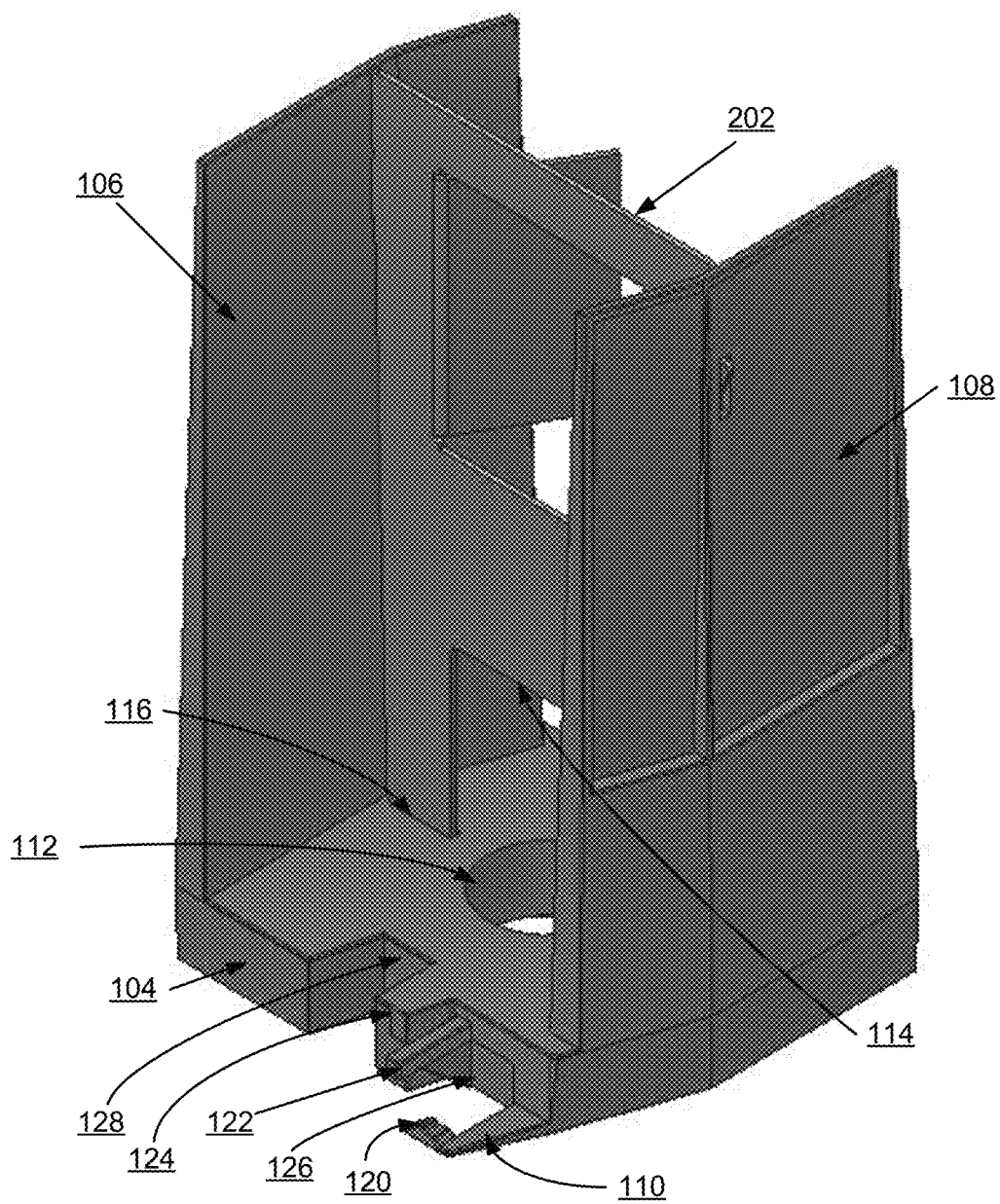

Referring now to FIGS. 1 and 2, there are shown perspective views not to scale schematically illustrating respective example structures generally designated by the reference character 100 in FIG. 1 and generally designated by the reference character 200 in FIG. 2. The respective structures 100, 200 include an example airflow control member holder 101 with a respective airflow control member 102, 202. Structure 100 includes an example perforation pattern member 102 with the example airflow control member holder 101 in accordance with an illustrative embodiment. Structure 200 includes an example airflow control baffle member 202 with the example airflow control member holder 101 in accordance with an illustrative embodiment.

The airflow control member holder 101 includes a base member 104 and a pair of opposed, upwardly extending sides 106, 108 receiving and retaining the respective airflow control member 102, 202, as shown in FIGS. 1 and 2. Each of the opposed, upwardly extending sides 106, 108 has compliance characteristics allowing easy removal and changing of the airflow control member 102, 202 to meet the system requirements.

Figure 3:
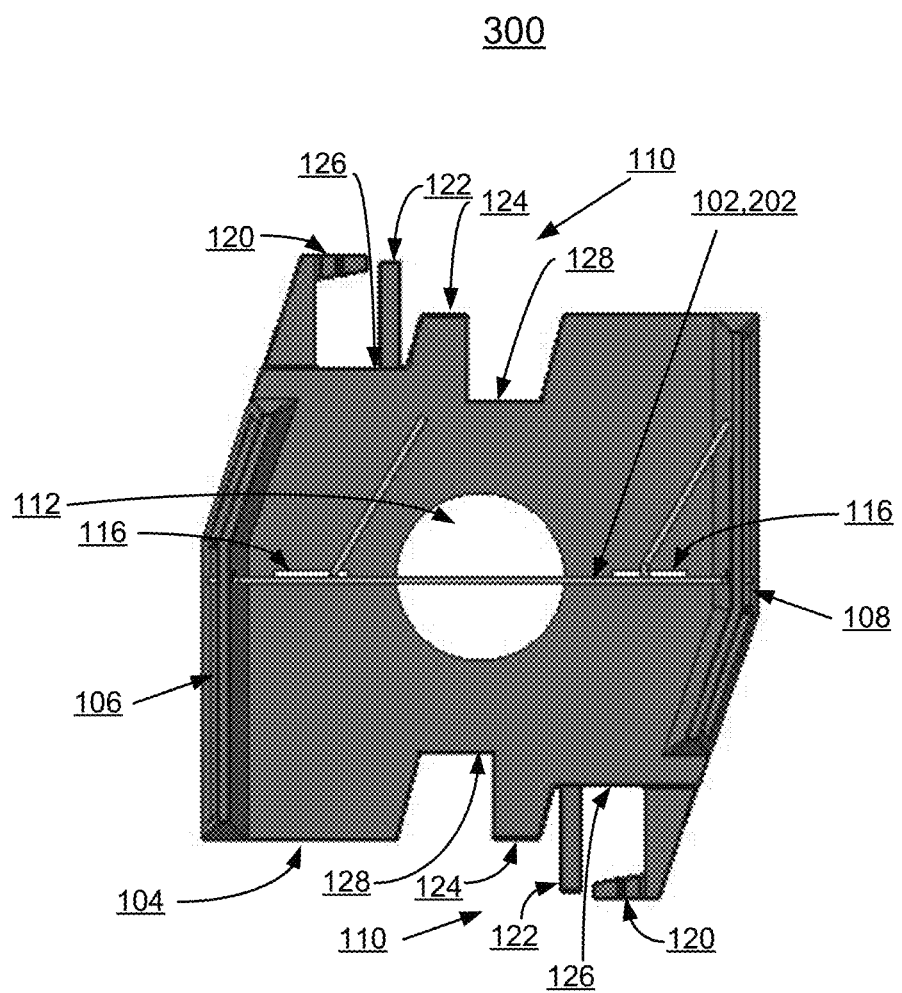
FIG. 3 is a top plan view not to scale schematically illustrating the example airflow control member holder with a respective airflow control member of FIGS. 1 and 2 in accordance with an illustrative embodiment.

Referring also to FIG. 3, there is shown a top plan view not to scale schematically illustrating the example airflow control member holder 101 with a respective airflow control member 102, 202 generally designated by the reference character 300 in accordance with an illustrative embodiment. Base member 104 of the airflow control member holder 101 includes mounting, retention features generally designated by the reference character 110 in accordance with an illustrative embodiment. As shown in FIG. 3, mounting, retention features 110 are provided on front and rear sides of the base member 104.

Figure 4:
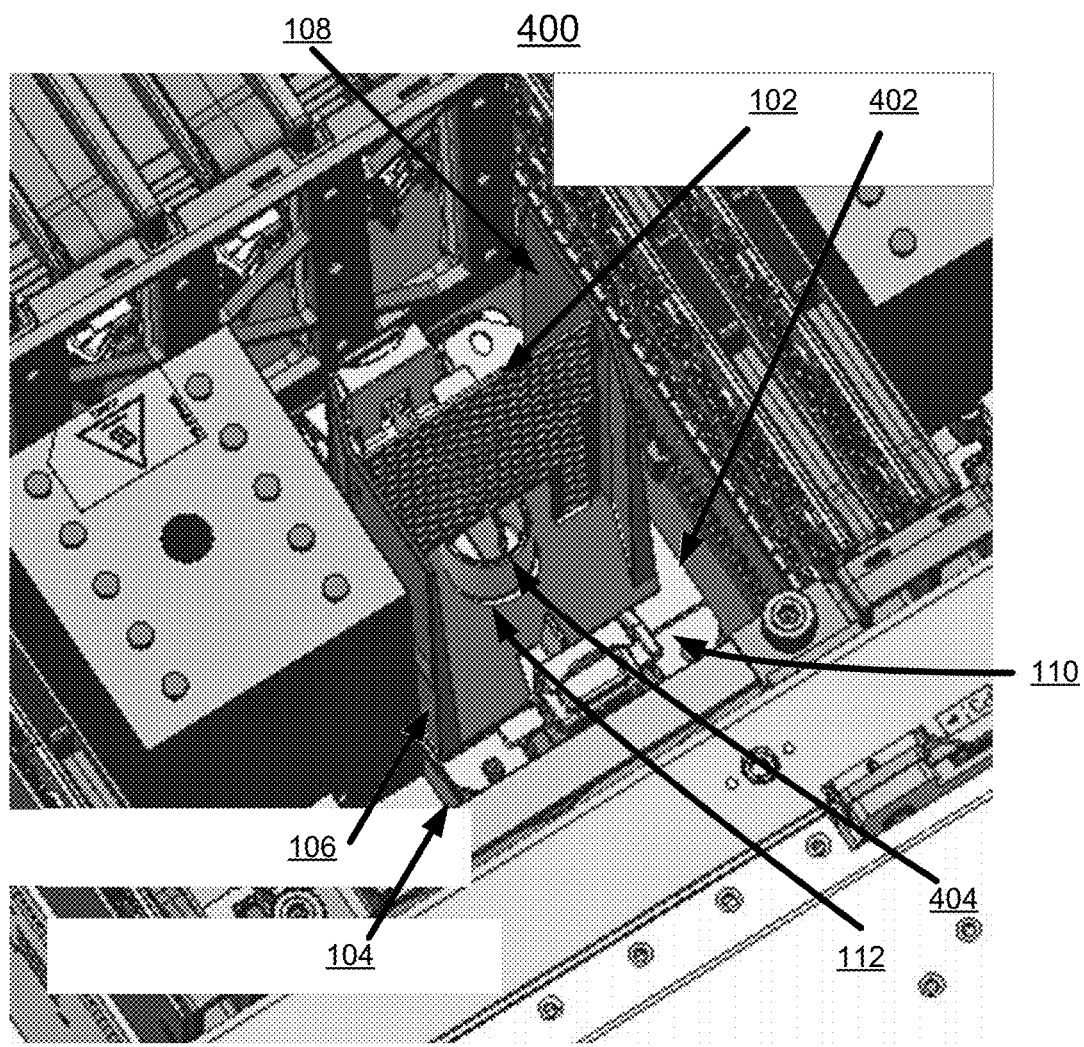
FIG. 4 is a perspective view not to scale schematically illustrating the example airflow control member holder with the perforation pattern airflow control member in FIG. 1 mounted in a system in accordance with an illustrative embodiment.

The base member 104 includes a generally centrally positioned opening 112 providing a protective function with a protective replacement structure for an associated system component, such as a depopulated component, a central processing unit (CPU) or other device in a system, for example, system 400 as shown in FIG. 4. Each respective airflow control member 102, 202 includes an aligned clearance space with opening 112 defined by a recessed wall portion 114 further providing a protective function with a system component. Base member 104 includes slots 116 receiving and positioning respective airflow control member 102, 202.

Retention features 110 of the base member 104 include an L-shaped feature 120, a pair of ledges 122, 124 outwardly extending from a cavity 126 and proximate a second cavity 128 that mate with corresponding features in the system. These features 120, 122, 124, 126 and 182 defining the respective retention features 110 are placed into an easy to remove retention feature in the system, such as defined baffling retention locations 402 that are specified throughout the system 400, as schematically illustrated in FIG. 4. The airflow control member holder 101 is easily installed in the system 400 using retention features 110 and easily removed as needed.

It should be understood that various modifications of the retention features 110 are possible in accordance with the spirit and teachings of the illustrative embodiments. The present disclosure is not limited to the illustrated retention features 110 of the example airflow control member holder.

Referring also to FIG. 4, there is shown a perspective view not to scale schematically illustrating a system generally designated by the reference character 400. As illustrated in FIG. 4, structure 100 with the example airflow control member holder 101 and the perforation pattern airflow control member 102 is mounted in the system 400 at a mating location 402 in accordance with an illustrative embodiment. The structures 100, and 200 advantageously are provided at selected various baffling locations 402 that are specified throughout the system 400. In system 400, the airflow control member holder 101 is built into a protective insert generally designated by the reference character 404 for a depopulated component, such as a CPU or another device. The airflow control member holder 101 including the easy to retention features 110 is installed in the system 400 and pulled out as needed. The airflow control member holder 101 has compliance that allows the perforation pattern airflow control member 102 and baffle airflow control member 202 to be completely separated from the airflow control member holder 101, such that the holder 101 remains in the system and functions as a protective element or to allow the perforation pattern airflow control member 102 and baffle airflow control member 202 to be modified and inserted into the holder 101 to meet the system requirements.

It should be understood that the present disclosure is not limited to the illustrated example airflow control member holder 101 and the illustrated airflow control members 102, 202, various modifications are possible in accordance with the spirit and teachings of the illustrative embodiments.

While the present disclosure has been described with reference to the details of the embodiments of the disclosure shown in the drawing, these details are not intended to limit the scope of the disclosure as claimed in the appended claims.

What is claimed is:

1. A structure for implementing selective airflow modification in a system, comprising:
    an airflow control member holder including a centrally positioned opening providing a protective function for an associated component including a central processing unit (CPU) socket in the system;
    the airflow control member holder having retention features to facilitate mounting and removal from the system; and
    the airflow control member holder includes upwardly extending opposed support sides retaining an airflow control member with an aligned clearance space with the opening, the opposed support sides having compliance characteristics allowing removal and changing of the airflow control member, wherein the airflow control member is one of a perforation plate airflow control member and a baffling member airflow control member, both of which are included in the structure and are configured to be interchangeable.

2. The structure as recited in claim 1, wherein the retention features of the airflow control member holder enable tool-less removal from a printed circuit board (PCB) of the system.

3. The structure as recited in claim 1, wherein the airflow control member can be selectively modified and mounted into the airflow control member holder to meet system cooling requirements.

4. The structure as recited in claim 1, includes the airflow control member holder providing a protective structure for a component in the system.

5. The structure as recited in claim 1, includes the retention features of the airflow control member holder configured for mounting and removal from a printed circuit board (PCB) in the system.

6. The structure as recited in claim 1, includes the airflow control member holder configured to be provided at one specified baffling location in the system.

7. The structure as recited in claim 1, wherein the airflow control member holder is formed of an electrically non-conductive material.

8. The structure as recited in claim 1, wherein the airflow control member is formed of a selected sheet metal material.

9. The structure as recited in claim 1, wherein the airflow control member is formed of a selected rigid molded material.

10. The structure as recited in claim 1, wherein the airflow control member holder enables toolless removal and insertion of the airflow control member.

11. The structure as recited in claim 1, wherein the airflow control member holder mounted on a printed circuit board (PCB) in the system enables complete removal of the airflow control member from the airflow control member holder.

12. The structure as recited in claim 1, wherein the retention features facilitating mounting and removal of the airflow control member holder utilize an associated component's mechanical support structure in the system.

\* \* \* \* \*